United States Patent [19]

Tatsumi et al.

[11] Patent Number: 4,613,486
[45] Date of Patent: Sep. 23, 1986

[54] SEMICONDUCTOR BOULE PULLING ROD

[75] Inventors: Masayoshi Tatsumi; Toshihiro Kotani, both of Osaka, Japan

[73] Assignee: Sumitomo Electric Industrial Co., Ltd., Osaka, Japan

[21] Appl. No.: 618,158

[22] Filed: Jun. 7, 1984

[30] Foreign Application Priority Data

Oct. 28, 1983 [JP] Japan ................. 58-203161

[51] Int. Cl.$^4$ ............................................. C30B 35/00
[52] U.S. Cl. ..................................... 422/310; 422/249; 156/617 SP; 156/DIG. 98
[58] Field of Search ............................ 422/249, 310; 156/617 SP, 621, DIG. 73, DIG. 98

[56] References Cited

U.S. PATENT DOCUMENTS

| | | | |
|---|---|---|---|
| 3,488,157 | 1/1970 | Koffer | 156/617 SP |
| 3,704,093 | 11/1972 | Haggerty et al. | 423/299 |
| 4,158,038 | 6/1979 | Jewett | 156/DIG. 73 |
| 4,187,139 | 2/1980 | Brice et al. | 156/617 SP |
| 4,478,676 | 10/1984 | Belt et al. | 156/DIG. 73 |

FOREIGN PATENT DOCUMENTS 158196  9/1980  Japan.

OTHER PUBLICATIONS

A. J. Singh, Journal of Crystal Growth, "A New Design for Water Cooled Czochralski Holder", 51, 635-636, 1981.

Primary Examiner—David L. Lacey
Attorney, Agent, or Firm—Sughrue, Mion, Zinn, Macpeak & Seas

[57] ABSTRACT

A single-crystal boule pulling rod for pulling a boule from a melt utilizing the Czochralski method including a main pulling rod and a heat insulating layer surrounding the main pulling rod. The main pulling rod, which may be either bar-shaped or composed of two concentric pipes, is forcibly cooled. Preferably, a pipe made of molybdenum or stainless steel is provided around the heat insulating material.

8 Claims, 6 Drawing Figures

SEMICONDUCTOR BOULE PULLING ROD

BACKGROUND OF THE INVENTION

This invention relates to a pulling rod which is used to pull a single-crystal boule from a melt according to the Czochralski method or the liquid encapsulated Czochralski method.

In accordance with the Czochralski method, as illustrated in FIG. 1, the surface of molten semiconductor material 1 is covered with molten $B_2O_3$ material (not shown) as required (in the case of the liquid encapsulated Czochralski method), and a seed crystal 3 secured to a pulling rod 2 is inserted into the molten material 1. After merging well with the molten material 1, the seed crystal 3 is pulled upwardly while being rotated, thereby to pull a single-crystal boule 4.

In general, when a single-crystal boule is pulled as described above, the heat flow pattern in the boule is as shown in FIG. 1. The single crystal grows at the equilibrium point of the heat of solidification heat flow $Q_1$ of the molten material 1, the heat flow $Q_2$ at the interface between solid and liquid, the radiated heat flow $Q_3$ from the surface of the boule 4, the heat flow $Q_4$ of cooling through gas convection, and the heat flow $Q_5$ through the rod 2.

In order to reduce the number of defects in crystal, a method may be employed in which the boule is pulled under a small temperature gradient. However, that method is disadvantageous in that, since the heat flows $Q_3$, $Q_4$ and $Q_5$ are decreased, it is difficult to increase the diameter of the boule, and accordingly it is difficult to produce large single-crystal boules.

In order to overcome the above-described drawbacks, a method of producing large single-crystal boules by forcibly cooling the pulling rod 2 and a method of producing large single-crystal boules by increasing the heat flow $Q_5$ have been proposed in the art (see Japanese Laid-Open Patent Application No. 158196/1980, and A. J. Singh, *J. Cryst. Growth*, 51, 635 (1981)).

Pulling rods for practicing these methods are as shown in FIGS. 2A and 2B. In the case of FIG. 2A, the pulling rod 5 has cooling fins 7. More specifically, the pulling rod 5 is made of a material such as molybdenum having a high thermal conductivity with the cooling fins 7 being provided at the upper end portion of the rod. A seed crystal 3 is secured to the lower end of the pulling rod 5 with a seed holder 6. Unfortunately, a large amount of heat flows into the rod through its side, and therefore the cooling effect of the seed part is low.

The pulling rod shown in FIG. 2B is of a dual-pipe type. Cooling gas or liquid introduced into the inner pipe 9 from above passes into the outer pipe 10 from the lower end of the inner pipe. The cooling gas or liquid thus moves upwardly in the outer pipe and is then discharged therefrom. A seed crystal 3 is secured to the rod as in the case of FIG. 2A. However, it has been found that when the cooling-type pulling rod made of dual pipes is used in a puller (such as a puller having a multi-stage heater such as an after-heater) which has a small temperature gradient, the pulling rod 8 or the cooling gas or liquid is exposed to the atmosphere at high temperature, and therefore the cooling effect through the seed crystal 3 is insufficient, and accordingly it is difficult to produce large single-crystal boules.

SUMMARY OF THE INVENTION

Therefore, an object of the present invention is to solve the above-described problems.

In accordance with the above and other objects, the invention provides a single crystal pulling rod comprising a main pulling rod and a heat insulating layer surrounding the main pulling rod in which the heat insulating layer prevents the main pulling rod from being heated by the heater or the like, as a result of which the boule is effectively cooled through the seed crystal and the boule can be pulled with an especially low temperature gradient.

Examples of the types of single-crystal boules which can be pulled with the pulling rod according to the invention are of the III-V groups compound semiconductors such as GaAs, GaP, InSb, InP and InAs, the II-VI groups compounds such as ZnS, ZnSe, CdS and CdSe, the IV group semiconductors such as Si and Ge, and oxides, nitrides, borides and carbides of these materials. The single-crystal boules are pulled according to the Czochralski method or the liquid encapsulated Czochralski method.

DESCRIPTION OF THE PREFERRED EMBODIMENTS

Figure 3:
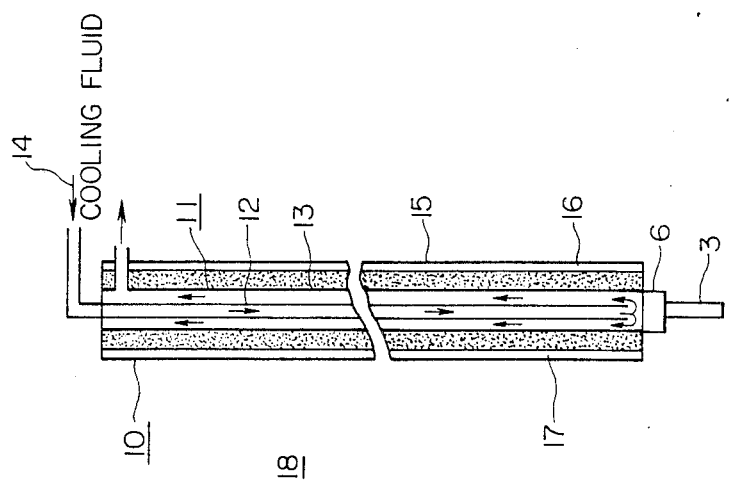
FIG. 3 is a vertical sectional view showing a pulling rod according to the invention.

A preferred embodiment of the invention will now be described with reference to the accompanying drawings. FIG. 3 is a longitudinal sectional view showing a pulling rod of the invention. As shown in FIG. 3, the pulling rod 10 is composed basically of three concentric pipes. In FIG. 3, reference numeral 11 designates a forcibly cooled rod (or main pulling rod) having a dual-pipe structure. The rod 11 includes an inner pipe 12 and middle pipe 13 which are made of a material such as molybdenum having a high thermal conductivity. The wall thickness of the middle pipe 13 is relatively large in order to increase the heat flow capability through the pulling rod. Cooling gas or liquid 14 is introduced into the inner pipe 12 from above and is then delivered into the middle pipe 13 through the lower end of the inner pipe 12. The cooling gas or liquid 14 thus delivered moves upwardly in the middle pipe 13 and is then discharged, thus forcibly cooling the rod 11.

The pulling rod 10 further includes an outer pipe 15 arranged coaxially with the forcibly cooled rod 11. The inner wall of the outer pipe 15 is lined with a radiation shielding layer 17 (of platinum, platinum-coated material or gold, for instance), and the space between the radiation shielding layer 17 and the outer wall of the middle pipe 13 is filled with heat insulating material 16. The outer pipe 15 is made of material having a low thermal conductivity such as stainless steel, ceramics, quartz, tungsten or tantalum. A seed crystal 3 is secured to the lower end of the forcibly cooled rod 11 with a seed holder.

The heat insulating material 16, the radiation shielding layer 17 and the outer pipe 15 form a heat insulating layer which thermally insulates the forcibly cooled rod 11 from the external atmosphere 18. The heat insulating layer blocks the flow of heat from the heater or the like through the external atmosphere 18 into the forcibly cooled rod 11. Accordingly, the cooling effect of the cooling gas or liquid is utilized effectively, and hence the boule is effectively cooled through the seed crystal 3 and the seed holder 6.

Accordingly, even when a boule is pulled with a low temperature gradient, the forcibly cooled rod 11 (main pulling rod) 11 is effectively cooled irrespective of the temperature of the external atmosphere 18, which is sometimes quite high, and therefore the boule is effectively cooled through the seed crystal 3. Accordingly, the diameter of the boule can be increased readily, and therefore it is possible to produce large boules. In this connection, the cooling efficiency can be adjusted by changing the flow rate and temperature of the cooling gas or liquid in accordance with the pulling conditions.

Figure 5:
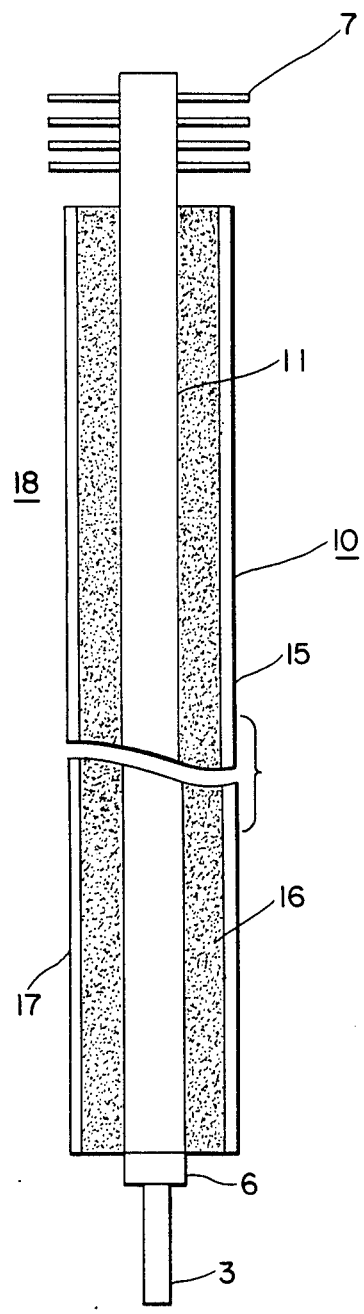
FIG. 5 is a vertical sectional view showing a bar shaped pulling rod according to the invention.

The main pulling rod provided inside the pulling rod is not limited to the forcibly cooled rod of the dual-pipe type as shown in FIG. 3. Other types of forcibly cooled rods (such as heat pipes) or main pulling rods having ordinary bar-shaped constructions as shown in FIG. 5 can provide the same effect.

EXAMPLES

One example A of the conventional pulling rod and two examples B and C of a pulling rod according to the invention, which have the following constructions, were manufactured:

A: The pulling rod had an ordinary bar-shaped construction, that is, no heat insulating layer was formed outside the pulling rod (the prior art).

B: The heat insulating layer was formed outside the pulling rod having an ordinary bar-shaped construction (the invention).

C: The heat insulating layer was provided outside the dual-pipe type forcibly cooled rod as shown in FIG. 3 (the invention).

The pulling rods of examples A and B and the forcibly cooled rod of example C were made of molybdenum and had an outside diameter of 20 mm. In examples B and C, the heat insulating material was zirconia, the outermost pipe was made of molybdenum or quartz, and cooling gas was used.

Figure 1:
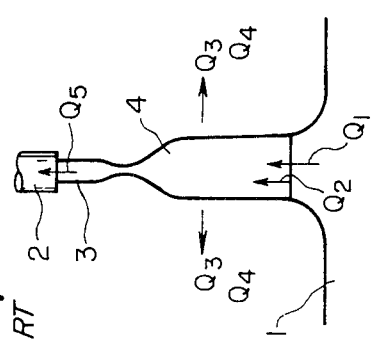
FIG. 1 is a vertical sectional view showing heat flows in a single crystal boule when the boule is being pulled.
Figure 2B:
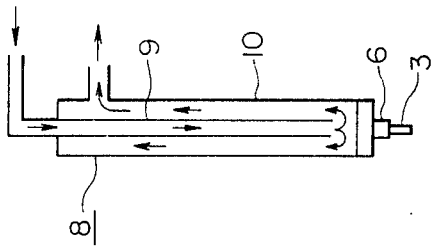
FIGS. 2A and 2B are vertical sectional views showing examples of a conventional pulling rod.
Figure 2A:
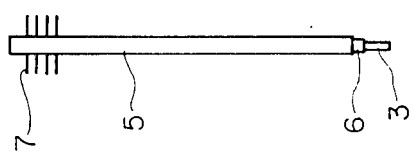
Figure 4:
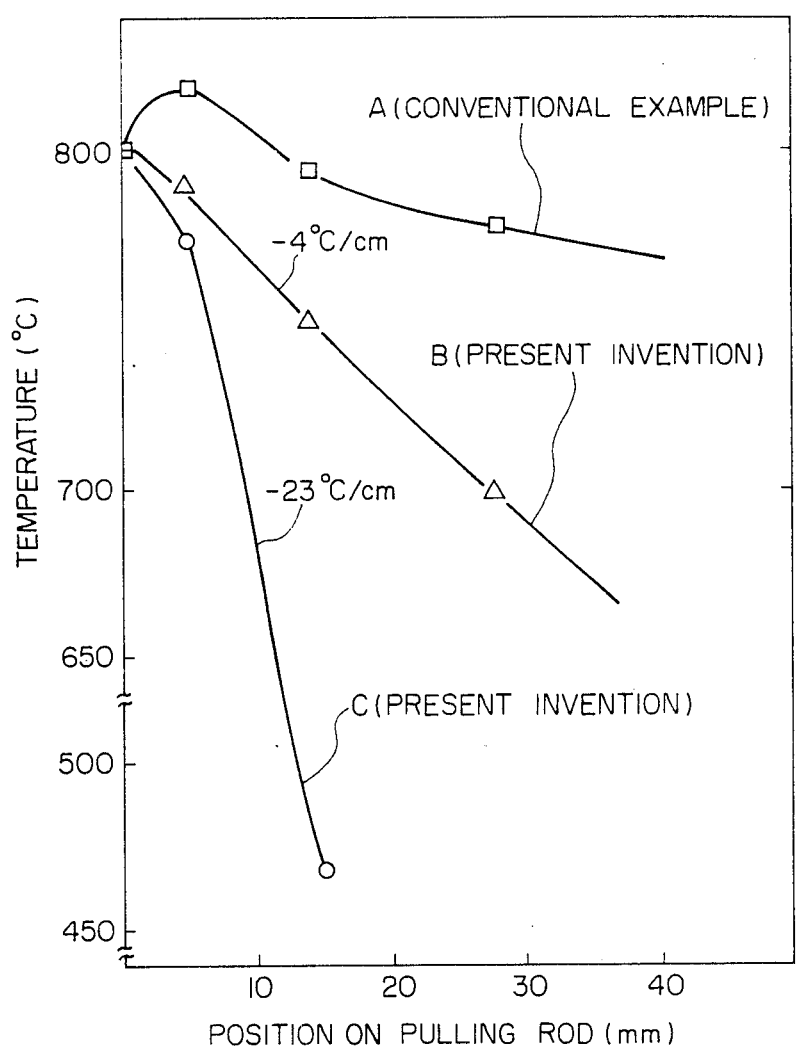
FIG. 4 is a graphical representation indicating the distributions of temperatures measured at various points on two examples of pulling rods according to the invention.

These pulling rods were inserted into a vertically oriented cylindrically shaped furnace having a uniform temperature profile. After the pulling rods were heated for 120 minutes, temperatures at various points on each pulling rod were measured. The results of these measurement are as indicated in FIG. 4. In these measurements, the temperature of the furnace was so controlled that the lower end of the pulling rod was at about 800° C. The heat flow rate ($Q_5$ in FIG. 1) through the pulling rod contributing to the growth of a single crystal is proportional to the temperature gradient dT/dZ at the lower end of the pulling rod. As shown in FIG. 4, the temperature gradient dT/dZ of example A (the prior art) was +5° C./cm, that of example B (the invention) was −4° C./cm, and that of example C (the invention) was −23° C./cm (the flow rate of gas being 10 liters/min). Thus, it is evident that the effect of the invention is significant.

Effects of the Invention

The pulling rod constructed as described above according to the invention has the following effects:

(a) Due to the presence of the heat insulating layer provided around the main pulling rod, the main pulling rod is thermally insulated from the external atmosphere. Accordingly, heat flow from the heater or the like into the pulling rod is prevented, the cooling effect of the main pulling rod is effectively utilized, and the boule is effectively cooled through the seed crystal.

Accordingly, even when a boule is pulled with a low temperature gradient, the boule is effectively cooled through the seed crystal. Therefore, the diameter of the boule can be readily increased, and it is possible to produce large boules having a low dislocation density.

(b) In the case where the forcibly cooled rod of the dual-pipe type is used as the pulling rod, owing to the heat insulating layer, the cooling effect of the cooling gas or liquid is not cancelled by the flow of heat from the heater or the like, and accordingly the boule is more effectively cooled down through the seed crystal.

The cooling effect can be adjusted changing the flow rate of the cooling gas or liquid.

We claim:

1. A single-crystal boule pulling rod for pulling a boule from a melt according to the Czochralski method, comprising:
   a main pulling rod having a seed holder at the lower end; and
   a heating insulating layer integrally attached to and surrounding said main pulling rod and extending the length of said rod with the exception of said seed holder.

2. The single crystal pulling rod as claimed in claim 1, further comprising means for forcibly cooling said main pulling rod.

3. The single crystal pulling rod of claim 2, wherein said main pulling rod comprises two concentric pipes.

4. The single crystal pulling rod as claimed in claim 3, wherein said two pipes are made of molybdenum.

5. The single crystal pulling rod of claim 1, wherein said main pulling rod is bar-shaped.

6. The single crystal pulling rod as claimed in claim 1, wherein said heat insulating layer comprises:
   a heat insulating material; and
   a pipe surrounding said heat insulating material.

7. The single crystal pulling rod as claimed in claim 6, wherein said pipe is made of a material selected from the group consisting of stainless steel and molybdenum.

8. The single crystal pulling rod as claimed in claim 6, wherein the inner wall of said pipe is coated with a radiation shielding material selected from the group consisting of gold and platinum.

* * * * *